(12) United States Patent
Yoshizaki et al.

(10) Patent No.: US 9,631,121 B2
(45) Date of Patent: Apr. 25, 2017

(54) POLISHING COMPOSITION

(71) Applicant: FUJIMI INCORPORATED, Kiyosu-shi, Aichi (JP)

(72) Inventors: Yukinobu Yoshizaki, Kiyosu (JP); Yoshihiro Izawa, Kiyosu (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 0 days.

(21) Appl. No.: 14/403,497

(22) PCT Filed: Mar. 12, 2013

(86) PCT No.: PCT/JP2013/056744
§ 371 (c)(1),
(2) Date: Nov. 24, 2014

(87) PCT Pub. No.: WO2013/179718
PCT Pub. Date: Dec. 5, 2013

(65) Prior Publication Data
US 2015/0152290 A1   Jun. 4, 2015

(30) Foreign Application Priority Data

May 29, 2012 (JP) .................... 2012-122194

(51) Int. Cl.
C09G 1/02 (2006.01)
B24B 37/04 (2012.01)
C23F 1/30 (2006.01)
C23F 3/06 (2006.01)
H01L 21/306 (2006.01)
C23F 3/04 (2006.01)
H01L 45/00 (2006.01)

(52) U.S. Cl.
CPC ............. *C09G 1/02* (2013.01); *B24B 37/044* (2013.01); *C23F 1/30* (2013.01); *C23F 3/04* (2013.01); *C23F 3/06* (2013.01); *H01L 21/30625* (2013.01); *H01L 45/06* (2013.01); *H01L 45/144* (2013.01); *H01L 45/1683* (2013.01)

(58) Field of Classification Search
CPC ... B24B 37/044; C09G 1/02; H01L 21/31053; G11C 13/0004; C09K 3/1463
See application file for complete search history.

(56) References Cited

U.S. PATENT DOCUMENTS

| | | | |
|---|---|---|---|
| 6,293,848 B1 | 9/2001 | Fang et al. | |
| 6,527,817 B1 | 3/2003 | Fang et al. | |
| 7,560,384 B2* | 7/2009 | Shida et al. | 438/692 |
| 7,915,071 B2 | 3/2011 | Siddiqui et al. | |
| 2002/0194789 A1 | 12/2002 | Oshima | |
| 2003/0124852 A1 | 7/2003 | Fang et al. | |
| 2007/0178700 A1 | 8/2007 | Dysard et al. | |
| 2009/0149006 A1 | 6/2009 | Kim | |
| 2010/0112906 A1 | 5/2010 | Liu | |
| 2010/0130013 A1* | 5/2010 | Liu et al. | 438/693 |
| 2010/0190339 A1 | 7/2010 | Chen et al. | |
| 2012/0003834 A1 | 1/2012 | Koo et al. | |

FOREIGN PATENT DOCUMENTS

| | | |
|---|---|---|
| JP | 2002-327170 A | 11/2002 |
| JP | 2003-514949 A | 4/2003 |
| JP | 2008-109025 A | 5/2008 |
| JP | 2009-016821 A | 1/2009 |
| JP | 2009-016829 A | 1/2009 |
| JP | 2009-147337 A | 7/2009 |
| JP | 2009-525615 A | 7/2009 |
| JP | 2010-114446 A | 5/2010 |
| JP | 2010-534934 A | 11/2010 |
| JP | 2011-165759 A | 8/2011 |
| JP | 2012-015519 A | 1/2012 |
| JP | 2012-040671 A | 3/2012 |
| WO | WO-2007/089824 A1 | 8/2007 |
| WO | WO-2009/017652 A2 | 2/2009 |

OTHER PUBLICATIONS

International Search Report issued in International Patent Application No. PCT/JP2013/056744 mailed May 14, 2013.
Japanese Office Action dated May 31, 2016 as received in corresponding Japanese Application No. 2012-122194 and its English translation thereof.

* cited by examiner

*Primary Examiner* — Duy Deo
(74) *Attorney, Agent, or Firm* — Foley & Lardner LLP

(57) ABSTRACT

A polishing composition is used to polish a polishing subject having a phase change alloy. The polishing composition includes abrasive grains and a brittle film formation agent. The brittle film formation agent is at least one or more selected from a saturated monocarboxylic acid and an organophosphorus compound.

8 Claims, No Drawings

POLISHING COMPOSITION

TECHNICAL FIELD

The present invention relates to a polishing composition suitable for polishing a polishing subject that has a phase change alloy.

BACKGROUND ART

A phase change material (PCM), which can be electrically switched between an insulative amorphous phase and a conductive crystalline phase, for an electronic memory application is used for a PRAM (phase change random-access memory) device (also known as an ovonic memory device or a PCRAM device). For typical phase change materials suitable for these applications, various elements of the VIB group (chalcogenide, for example, Te or Po) and the VP group (for example, Sb) in the periodic table are used in combination with one or more metal elements, such as In, Ge, Ga, Sn, or Ag. A particularly useful phase change material is a germanium (Ge)-antimony (Sb)-tellurium (Te) alloy (GST alloy). These materials can reversibly change their physical conditions depending on the heating/cooling rate, temperature, and time. Examples of other useful alloys include indium antimonite (InSb). The memory information in the PRAM device is stored with minimized loss due to the conduction characteristics of different physical phases or states.

Chemical mechanical polishing (CMP) is known as a process for polishing a metal-containing surface of a semiconductor substrate (for example, integrated circuit). The polishing composition used in CMP typically contains abrasive grains, an oxidizing agent, and a complexing agent to effectively polish the surface through etching.

The CMP can be performed to manufacture a memory device using a phase change material. However, unlike a conventional metal layer composed of a single component such as copper (Cu) or tungsten (W), the phase change material subject to polishing is prepared by mixing sulfur (S), cerium (Ce), germanium (Ge), antimony (Sb), tellurium (Te), silver (Ag), indium (In), tin (Sn), and gallium (Ga) at a specific ratio that allows reversible phase change between a crystal phase and an amorphous phase. For this reason, the physical properties of many phase change materials (for example, GST) differ from the physical properties of conventional metal layer materials, for example, are "softer" than other materials used in a PCM chip. Therefore, it is difficult to use the polishing composition for polishing present metal-containing surfaces to polish a phase change material.

Under such a situation, various studies have been conducted on polishing compositions suitable for polishing a polishing subject having a phase change alloy. For example, Patent Document 1 discloses a polishing composition for polishing a polishing subject having a phase change alloy and containing abrasive grains and a nitrogen compound. Further, Patent Document 2 discloses a polishing composition for polishing a polishing subject having a phase change alloy and containing abrasive grains and iron ions or an iron chelate complex. However, these inventions alone are not sufficient as a polishing composition for polishing a polishing subject having a phase change alloy. Thus, there is room for improvements.

PRIOR ART DOCUMENTS

Patent Documents

Patent Document 1: Japanese Laid-Open Patent Publication No. 2009-016821
Patent Document 2: Japanese Laid-Open Patent Publication No. 2009-016829

SUMMARY OF THE INVENTION

Problems that the Invention is to Solve

Accordingly, it is an object of the present invention to provide a polishing composition that can be suitably used in an application for polishing a polishing subject having a phase change alloy. Particularly, it is an object of the present invention to provide a polishing composition capable of obtaining a high polishing rate without depending on an oxidizing agent and a complexing agent contained in typical polishing compositions for polishing conventional metal-containing surfaces.

Means for Solving the Problems

As a result of extensive and intensive studies, the inventors of the present invention have found a polishing composition capable of obtaining a high polishing rate for a polishing subject having a phase change alloy by incorporating abrasive grains and a specific brittle film formation agent.

The gist of the present invention is as follows.

<1> A polishing composition used to polish a polishing subject having a phase change alloy. The polishing composition includes abrasive grains and a brittle film formation agent. The brittle film formation agent is at least one or more selected from a saturated monocarboxylic acid and an organophosphorus compound.

<2> In the polishing composition, the abrasive grains are colloidal silica.

<3> In the polishing composition, the colloidal silica is colloidal silica on which an organic acid is immobilized.

<4> In the polishing composition, the brittle film formation agent is at least one or more selected from saturated monocarboxylic acids.

<5> In the polishing composition, the saturated monocarboxylic acid is at least one or more selected from acetic acid, glycolic acid, lactic acid, and salicylic acid.

<6> In the polishing composition, the brittle film formation agent is at least one or more selected from organophosphorus compounds.

<7> In the polishing composition, the organophosphorus acid is at least one or more selected from phosphonic acid, an alkyl phosphonic acid, HEDP, and phosphinic acid.

<8> A polishing composition used to polish a polishing subject having a phase change alloy. The polishing composition includes a brittle film formation agent.

<9> In the polishing composition, the phase change alloy is GST.

<10> A polishing method including polishing a surface of a polishing subject having a phase change alloy using the polishing composition according to any one of <1> to <8> listed above.

<11> A method for manufacturing a substrate including the step of polishing a surface of a polishing subject having a phase change alloy using the polishing composition according to any one of <1> to <8> listed above.

Effect of the Invention

The present invention provides a polishing composition that can be suitably used in an application for polishing a polishing subject having a phase change alloy. In particular, the present invention provides a polishing composition that effectively increases the polishing rate.

EMBODIMENTS OF THE INVENTION

Hereinafter, one embodiment of the present invention will be described.

A polishing composition of the present embodiment contains abrasive grains and a specific brittle film formation agent.

The polishing composition is used to polish a polishing subject having a phase change alloy. The phase change alloy is used as a material which can be electrically switched between an insulative amorphous phase and a conductive crystalline phase for an electronic memory application in a PRAM (phase change random-access memory) device (also known as an ovonic memory device or a PCRAM device). For the phase change alloy suitable for these applications, various elements of the VIB group (chalcogenide, for example, Te or Po) and the VB group (for example, Sb) in the periodic table are used in combination with one or more metal elements such as In, Ge, Ga, Sn, or Ag. A particularly useful phase change material is a germanium (Ge)-antimony (Sb)-tellurium (Te) alloy (GST alloy).

Abrasive Grains

The polishing composition contains abrasive grains. The abrasive grains may be any one of inorganic particles, organic particles, and organic-inorganic composite particles. Specific examples of the inorganic particles include particles composed of metal oxides such as silica, alumina, ceria, and titania, silicon nitride particles, silicon carbide particles, and boron nitride particles. Specific examples of the organic particles include polymethyl methacrylate (PMMA) particles. Among them, silica particles are preferred, and colloidal silica is particularly preferred.

The abrasive grains may be surface-modified. Since common colloidal silica has a zeta potential value that is close to zero under acidic conditions, silica particles do not electrically repel each other and thus easily cause aggregation under acidic conditions. In contrast, abrasive grains that are surface-modified so that the zeta potential may have a relatively large positive or negative value even under acidic conditions strongly repel each other even under acidic conditions and are thus satisfactorily dispersed. This improves the storage stability of the polishing composition. Such surface-modified abrasive grains can be obtained, for example, by mixing a metal such as aluminum, titanium, and zirconium or an oxide thereof with abrasive grains to allow the surface of the abrasive grains to be doped with the metal or oxide thereof.

Alternatively, the surface-modified abrasive grains in the polishing composition may be silica on which an organic acid is immobilized. Among these, colloidal silica on which an organic acid is immobilized can be preferably used. Immobilization of an organic acid on colloidal silica is performed by chemically bonding a functional group of the organic acid to the surface of colloidal silica. Immobilization of an organic acid on colloidal silica will not be achieved only by allowing colloidal silica and an organic acid to be present together. When a sulfonic acid which is a type of organic acid is intended to be immobilized on colloidal silica, the immobilization can be performed, for example, by a method described in "Sulfonic acid-functionalized silica through quantitative oxidation of thiol groups", Chem. Commun. 246-247 (2003). Specifically, a silane coupling agent having a thiol group, such as 3-mercaptopropyltrimethoxysilane, is coupled with colloidal silica, and then the thiol group is oxidized with hydrogen peroxide, which is capable of obtaining colloidal silica with a sulfonic acid immobilized on the surface thereof. Alternatively, when a carboxylic acid is intended to be immobilized on colloidal silica, the immobilization can be performed, for example, by a method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, a silane coupling agent containing a photoreactive 2-nitrobenzyl ester is coupled with colloidal silica and then subjected to light irradiation, which is capable of obtaining colloidal silica with a carboxylic acid immobilized on the surface thereof.

The content of the abrasive grains in the polishing composition is preferably 0.1 mass % or greater, more preferably 0.5 mass % or greater, and further preferably 1 mass % or greater. As the content of the abrasive grains increases, there is an advantage of increasing the removal rate of the subject polished by the polishing composition.

Further, the content of the abrasive grains in the polishing composition is preferably 20 mass % or less, more preferably 15 mass % or less, and further preferably 10 mass % or less. As the content of the abrasive grains decreases, the material cost of the polishing composition can be suppressed.

The average primary particle size of the abrasive grains is preferably 5 nm or greater, more preferably 7 nm or greater, and further preferably 10 nm or greater. As the average primary particle size of the abrasive grains increases, there is an advantage of increasing the removal rate of the subject polished by the polishing composition. The value of the average primary particle size of the abrasive grains can be calculated, for example, based on the specific surface area of the abrasive grains measured by the BET method.

Further, the average primary particle size of the abrasive grains is preferably 100 nm or less, more preferably 90 nm or less, further preferably 80 nm or less. As the average primary particle size of the abrasive grains decreases, a polished surface with little surface defects can be easily obtained by polishing the polishing subject using the polishing composition.

The average secondary particle size of the abrasive grains is preferably 150 nm or less, more preferably 120 nm or less, and further preferably 100 nm or less. The value of the average secondary particle size of the abrasive grains can be measured, for example, by a laser light scattering method.

The average degree of association of the abrasive grains, which is obtained by dividing the value of the average secondary particle size of the abrasive grains by the value of the average primary particle size thereof, is preferably 1.2 or greater and more preferably 1.5 or greater. As the average degree of association of the abrasive grains increases, there is an advantage of increasing the removal rate of the subject polished by the polishing composition.

The average degree of association of the abrasive grains is preferably 4 or less, more preferably 3 or less, and further preferably 2 or less. As the average degree of association of the abrasive grains decreases, a polished surface with little surface defects can be easily obtained by polishing the polishing subject with the polishing composition.

Brittle Film Formation Agent

The polishing composition contains a brittle film formation agent that is at least one or more selected from a saturated monocarboxylic acid and an organophosphorus acid. In typical polishing compositions for polishing conventional metal-containing surfaces, a metal subject to polishing is oxidized with an oxidizing agent contained in the polishing composition to form a metal oxide, and the metal oxide is further dissolved by a complexing agent to perform polishing. In contrast, in the polishing composition of the present invention, it is conceivable that the brittle film formation agent contained in the polishing composition is complexed with a phase change alloy surface to form an insoluble brittle film, and a high polishing rate is obtained by mechanically polishing the brittle film with abrasive grains.

Examples of the saturated monocarboxylic acid used as a brittle film formation agent include acetic acid, lactic acid, propionic acid, butyric acid, glycolic acid, gluconic acid, salicylic acid, isonicotinic acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid, 3,3-dimethylbutanoic acid, heptanoic acid, octanoic acid, nonanoic acid, and decanoic acid. The saturated monocarboxylic acid preferably has 2 to 6 carbon atoms, more preferably 2 to 4 carbon atoms. The polishing composition preferably contains, as the saturated monocarboxylic acid having 2 to 6 carbon atoms, at least one or more compound selected from the group consisting of acetic acid, lactic acid, propionic acid, butyric acid, glycolic acid, gluconic acid, salicylic acid, isonicotinic acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid, and 3,3-dimethylbutanoic acid, in terms of being easily complexed with a phase change alloy surface to form an insoluble brittle film, resulting in obtaining a high polishing rate. The saturated monocarboxylic acid may be a salt. Further, the saturated monocarboxylic acid may be one of the above examples or a combination of two or more of the above examples.

The upper limit of the content of the saturated monocarboxylic acid in the polishing composition is preferably 10 mass %, more preferably 8 mass %, and further preferably 5 mass %. A decrease in the content of the saturated monocarboxylic acid reduces the manufacturing cost and is thus preferable.

The lower limit of the content of the saturated monocarboxylic acid in the polishing composition is preferably 0.001 mass %, more preferably 0.01 mass %, and further preferably 0.1 mass %. An increase in the content of the saturated monocarboxylic acid increases the polishing rate and is thus preferable.

Examples of an organophosphorus compound, which refers to an organic compound containing a carbon (C)-phosphorus (P) bond, when used as a brittle film formation agent include an acid and a halide of trivalent phosphorus such as phosphine, phosphine oxide, phosphine sulfide, and diphosphane, a phosphonium salt, phosphonic acid, phosphinic acid, and derivatives thereof. Phosphinic acid and phosphonic acid are preferred since they are easily complexed with a phase change alloy surface to form an insoluble brittle film and thereby obtains a high polishing rate. More specifically, the polishing composition preferably contains at least one or more compound selected from the group consisting of 2-aminoethylphosphonic acid, 1-hydroxyethylidene-1,1-diphosphonic acid, amino tri(methylene phosphonic acid), ethylenediamine tetra(methylene phosphonic acid), diethylenetriamine penta(methylene phosphonic acid), ethane-1,1,-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, α-methylphosphonosuccinic acid, phenylphosphonic acid, and phosphinic acid. The organophosphorus compound may be a salt. Further, the organophosphorus compound may be one of the above examples or a combination of two or more of the above examples.

The upper limit of the content of the organophosphorus compound in the polishing composition is preferably 10 mass %, more preferably 8 mass %, and further preferably 5 mass %. A decrease in the content of the organophosphorus compound reduces the manufacturing cost and is thus preferable.

The lower limit of the content of the organophosphorus compound in the polishing composition is preferably 0.001 mass %, more preferably 0.01 mass %, and further preferably 0.1 mass %. An increase in the content of the organophosphorus compound increases the polishing rate and is thus preferable.

pH of Polishing Composition and pH Adjuster

The upper limit of the pH of the polishing composition is not particularly limited but is preferably 12 and more preferably 10. The operability of the polishing composition improves as the pH decreases.

The lower limit of the pH of the polishing composition is also not particularly limited but is preferably 1 and more preferably 3. The dispersibility of the abrasive grains in the polishing composition improves as the pH increases.

A pH adjuster used when necessary to adjust the pH of the polishing composition to a desired value may be acid or alkali and may be an inorganic compound or an organic compound.

Oxidizing Agent

The polishing composition may further contain an oxidizing agent. The oxidizing agent acts to oxidize the surface of a polishing subject. When added to the polishing composition, the oxidizing agent has an effect of increasing the polishing rate with the polishing composition. However, when a polishing subject has a phase change alloy, excessive polishing will be caused if the polishing subject is polished with a typical polishing composition for polishing a conventional metal-containing surface. This is probably because the characteristics of a conventional metal (such as copper) used in a semiconductor device differ from the characteristics of the phase change alloy, and when the polishing subject has a phase change alloy, the content of the oxidizing agent is preferably lower.

The upper limit of the content of the oxidizing agent in the polishing composition is preferably 10 mass % and more preferably 5 mass %. As the content of the oxidizing agent decreases, excessive oxidation of the phase change alloy by the oxidizing agent becomes limited, and excessive polishing can be suppressed.

The lower limit of the content of the oxidizing agent in the polishing composition is preferably 0.1 mass % and more preferably 0.3 mass %. The polishing rate increases as the content of the oxidizing agent increases.

Examples of the oxidizing agent that can be used include peroxides. Specific examples of the peroxides include hydrogen peroxide, peracetic acid, percarbonates, urea peroxide, perchloric acid, and persulfates such as sodium persulfate, potassium persulfate, and ammonium persulfate. Among these examples, persulfates and hydrogen peroxide are preferred due to the polishing rate, and hydrogen peroxide is particularly preferred due to the stability in an aqueous solution and the load on the environment.

Complexing Agent

The polishing composition may further contain a complexing agent. The complexing agent contained in the polishing composition acts to chemically etch the surface of a phase change alloy and thus increases the polishing rate with the polishing composition. However, when a polishing subject has a phase change alloy, polishing of the polishing subject with a typical polishing composition for polishing a conventional metal-containing surface will cause excessive etching that results in excessive polishing. This is probably because the characteristics of a conventional metal (such as Cu) used in a semiconductor device differ from the characteristics of the phase change alloy. When the polishing subject has a phase change alloy, the content of the oxidizing agent is preferably lower.

The upper limit of the content of the complexing agent in the polishing composition is preferably 10 mass % and more preferably 1 mass %. As the content of the complexing agent decreases, excessive etching of the phase change alloy with the complexing agent becomes limited. As a result, excessive polishing can be suppressed.

The lower limit of the content of the complexing agent in the polishing composition is preferably 0.01 mass % and more preferably 0.1 mass %. As the content of the complexing agent increases, the etching effect of the phase change alloy increases. This increases the polishing rate with the polishing composition.

Examples of the complexing agent that can be used include inorganic acids, organic acids, and amino acids. Specific examples of the inorganic acids include sulfuric acid, nitric acid, boric acid, carbonic acid, hypophosphorous acid, phosphorous acid, and phosphoric acid. Specific examples of the organic acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid. Organic sulfonic acids such as methanesulfonic acid, ethanesulfonic acid, and isethionic acid can also be used. A salt, such as an alkali metal salt of an inorganic acid or an organic acid, may be used instead of an inorganic acid or an organic acid or in combination with an inorganic acid or an organic acid. Specific examples of the amino acids include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, vicine, Tricine, 3,5-diiodo-tyrosine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine, and tryptophan. Among these examples, glycine, alanine, malic acid, tartaric acid, citric acid, glycolic acid, and isethionic acid, or salts thereof are preferred as a complexing agent since the polishing can be improved.

Metal Corrosion Inhibitor

The polishing composition may further contain a metal corrosion inhibitor. Addition of the metal corrosion inhibitor to the polishing composition has an effect of further decreasing the occurrence of surface defects such as dishing in the phase change alloy after polishing is performed with the polishing composition. In addition, when the polishing composition contains the oxidizing agent and/or the complexing agent, the metal corrosion inhibitor relieves the oxidation of the phase change alloy surface by the oxidizing agent and also reacts with metal ions, which are produced by the oxidation of a metal of the phase change alloy surface by the oxidizing agent, to produce an insoluble complex. As a result, the etching of the phase change alloy by the complexing agent can be suppressed, and excessive polishing can be suppressed.

Although the type of the metal corrosion inhibitor that can be used is not particularly limited, a heterocyclic compound is preferred. The number of members in heterocyclic rings in the heterocyclic compound is not particularly limited. Further, the heterocyclic compound may be a monocyclic compound or a polycyclic compound having a condensed ring.

Specific examples of the heterocyclic compound as a metal corrosion inhibitor include nitrogen-containing heterocyclic compounds such as pyrrole compounds, pyrazole compounds, imidazole compounds, triazole compounds, tetrazole compounds, pyridine compounds, pyrazine compounds, pyridazine compounds, pyrimidine compounds, indolizine compounds, indole compounds, isoindole compounds, indazole compounds, purine compounds, quinolizine compounds, quinoline compounds, isoquinoline compounds, naphthyridine compounds, phthalazine compounds, quinoxaline compounds, quinazoline compounds, cinnoline compounds, Buterizine compounds, thiazole compounds, isothiazole compounds, oxazole compounds, isoxazole compounds, and furazan compounds. Specific examples of the pyrazole compounds include 1H-pyrazole, 4-nitro-3-pyrazole carboxylic acid, and 3,5-pyrazole carboxylic acid. Specific examples of the imidazole compounds include imidazole, 1-methylimidazole, 2-methylimidazole, 4-methylimidazole, 1,2-dimethylpyrazol, 2-ethyl-4-methylimidazole, 2-isopropylimidazole, benzimidazole, 5,6-dimethylbenzimidazole, 2-aminobenzimidazole, 2-chlorobenzimidazole, and 2-methylbenzimidazole. Specific examples of the triazole compounds include 1,2,3-triazole, 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazol-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-diheptyl-4H-1,2,4-triazole, 5-methyl-1,2,4-triazole-3,4-diamine, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5,6-dimethyl-1H-benzotriazole, and 1-(1",2'-dicarboxy ethyl)benzotriazole. Specific examples of the tetrazole compounds include 1H-tetrazole, 5-methyltetrazole, 5-aminotetrazole, and 5-phenyltetrazole. Specific examples of the indole compounds include 1H-indole, 1-methyl-1H-indole, 2-methyl-1H-indole, 3-methyl-1H-indole, 4-methyl-1H-indole, 5-methyl-1H-indole, 6-methyl-1H-indole, and 7-methyl- 1H-indole. Specific examples of the indazole compounds include 1H-indazole and 5-amino-1H-indazole. Since these heterocyclic compounds have high chemical or physical adsorption capability with respect to the phase change alloy, they form a stronger protective film on the phase change alloy surface. Accordingly, excessive etching of the phase change alloy after polishing using the polishing composition can be suppressed. For this reason, excessive polishing of the phase change alloy can be suppressed.

The upper limit of the content of the metal corrosion inhibitor in the polishing composition is preferably 10 mass %, more preferably 5 mass %, and further preferably 1 mass %. A decrease in the content of the metal corrosion inhibitor increases the polishing rate with the polishing composition.

The lower limit of the content of the metal corrosion inhibitor in the polishing composition is preferably 0.001 mass %, more preferably 0.01 mass %, and further preferably 0.1 mass %. As the content of the metal corrosion inhibitor increases, excessive etching of the phase change alloy after performing polishing with the polishing composition can be suppressed. For this reason, excessive polishing can be suppressed.

Another embodiment of the present invention provides a polishing method in which the surface of a polishing subject having a phase change alloy is polished with a polishing composition of the present invention. Examples of a pad that can be used in the present polishing method include, but are not limited to, a typical nonwoven fabric, a polyurethane foam, and a porous fluororesin. Further, the polishing pad may be processed to include grooves that accumulate a polishing composition.

The lower limit of the hardness of the polishing pad for polishing a polishing subject having a phase change alloy is preferably a Shore D hardness of 50. A higher Shore D hardness of the pad increases the mechanical action of the pad and improves the polishing rate. Further, the polishing composition according to the embodiment of the present invention is advantageous in that a high polishing rate can be obtained without containing abrasive grains. Thus, the lower limit of the Shore D hardness is more preferably 60.

The upper limit of the hardness of the polishing pad for polishing a polishing subject having a phase change alloy is preferably a Shore D hardness of 99. A lower Shore D hardness of the pad limits scratching of the polishing subject. Thus, the upper limit of the Shore D hardness is further preferably 95. If the pad hardness is less than 50, the mechanical action of the pad will be reduced, thus reducing the polishing rate. The Shore D hardness is defined not to take a value of 100 or greater. The Shore D hardness of the pad can be measured with a Shore D hardness meter.

A polishing pad having a Shore D hardness of 50 or greater may be made of a foam or a non-foam body such as cloth and a nonwoven fabric. Examples of the material of the polishing pad that can be used include resins such as polyurethane, acrylics, polyester, an acrylic-ester copolymer, polytetrafluoroethylene, polypropylene, polyethylene, poly4-methylpentene, cellulose, cellulose ester, polyamide such as nylon and aramid, polyimide, polyimidoamide, a polysiloxane copolymer, an oxirane compound, a phenol resin, polystyrene, polycarbonate, and an epoxy resin.

The present embodiment has the following advantages.

When using a typical polishing composition to polish a conventional metal-containing surface, the polished metal is oxidized with an oxidizing agent contained in the polishing composition to form a metal oxide, and the metal oxide is then dissolved by a complexing agent to perform polishing. In contrast, when using the polishing composition of the present embodiment, it is understood that the brittle film formation agent contained in the polishing composition is complexed with a phase change alloy surface to form an insoluble film, and the insoluble film is mechanically polished with abrasive grains. As a result, the polishing rate can be improved.

The above embodiment may be changed as follows.

When necessary, the polishing composition of the above embodiment may further contain known additives such as a surfactant, a water-soluble polymer, and a preservative.

The polishing composition of the above embodiment may be one-component type or a multiple-component type such as a two-component type.

The polishing composition of the above embodiment may be prepared by diluting a stock solution of the polishing composition with water.

Next, examples of the present invention and comparative examples will be described.

The polishing compositions of Examples 1 to 14 and Comparative Examples 1 to 21 were adjusted by mixing each of the components to obtain the compositions described in Table 1. The column of "Type" in the column of "Brittle film formation agent" in Table 1 shows, in the examples, the type of brittle film formation agents selected from saturated monocarboxylic acids and organophosphorus compounds contained in each of the polishing compositions, and, in the comparative examples, shows the type of additives other than the brittle film formation agents selected from the saturated monocarboxylic acids and organophosphorus compounds and additives selected from complexing agents and corrosion inhibitors contained in typical polishing compositions for polishing conventional metal-containing surfaces contained in each of the polishing compositions. Further, the column of "Content (mass %)" shows the content of the brittle film formation agent or an additive other than the brittle film formation agent in each of the polishing compositions. In the same column, the notation "-" shows that the brittle film formation agent or any additive other than the brittle film formation agent is not contained. The column of "pH" in Table 1 shows the pH of each of the polishing compositions. Further, colloidal silica having an average secondary particle size of about 60 nm (an average primary particle size of 30 nm) is used as the abrasive grains in Table 1, and the column of "Abrasive grains" shows the content. Further, the pH was adjusted to a predetermined value by adding an inorganic acid or an inorganic base. Although not shown in Table 1, aqueous hydrogen peroxide was added to each of the polishing compositions as an oxidizing agent so that the content of hydrogen peroxide was 2.1 mass.

A blanket wafer containing a GST alloy (the mass % ratio of Ge, Sb, and Te is 2:2:5) was polished under the conditions shown in Table 2 using each of the polishing compositions of Examples 1 to 14 and Comparative Examples 1 to 21. The thicknesses of the blanket wafer before polishing and the thickness of the blanket wafer after polishing for a predetermined period of time under the conditions shown in Table 2 were determined from the measurement of sheet resistance by the direct current four-probe method, and the polishing rate was determined by dividing the difference between the thickness of the blanket wafer before polishing and after polishing by the polishing time. The results are shown in the column of "Polishing rate" in the column of "Evaluation" in Table 1.

TABLE 1

| | Abrasive grains Content (mass %) | Brittle film formation agent Type | Brittle film formation agent Content (mass %) | pH | Evaluation Polishing rate (Å/min) |
|---|---|---|---|---|---|
| Example 1 | 2.5 | Acetic acid | 0.8 | 3 | 136 |
| Example 2 | 2.5 | Acetic acid | 0.8 | 10 | 173 |
| Example 3 | 2.5 | Lactic acid | 1.3 | 10 | 158 |
| Example 4 | 2.5 | Glycolic acid | 1.1 | 3 | 156 |
| Example 5 | 2.5 | Glycolic acid | 1.1 | 10 | 243 |
| Example 6 | 2.5 | Gluconic acid | 2.7 | 10 | 113 |
| Example 7 | 2.5 | Salicylic acid | 1.9 | 10 | 126 |
| Example 8 | 2.5 | Isonicotinic acid | 1.9 | 10 | 108 |
| Comparative Example 1 | 2.5 | Hydrochloric acid | 0.5 | 3 | 45 |
| Comparative Example 2 | 2.5 | Hydrochloric acid | 0.5 | 10 | 87 |
| Comparative Example 3 | 2.5 | Nitric acid | 0.9 | 3 | 85 |
| Comparative Example 4 | 2.5 | Nitric acid | 0.9 | 10 | 75 |
| Comparative Example 5 | 2.5 | Citric acid | 2.7 | 3 | 65 |
| Comparative Example 6 | 2.5 | Citric acid | 2.7 | 10 | 89 |
| Comparative Example 7 | 2.5 | Iminodiacetic acid | 1.9 | 3 | 88 |
| Comparative Example 8 | 2.5 | Iminodiacetic acid | 1.9 | 10 | 98 |
| Example 9 | 2.5 | Phenylphosphonic acid | 2.2 | 3 | 105 |
| Example 10 | 2.5 | Phenylphosphonic acid | 2.2 | 10 | 234 |
| Example 11 | 2.5 | HEDP | 2.9 | 3 | 142 |
| Example 12 | 2.5 | HEDP | 2.9 | 10 | 182 |
| Example 13 | 2.5 | Phosphinic acid | 0.9 | 3 | 103 |
| Example 14 | 2.5 | Phosphinic acid | 0.9 | 10 | 139 |
| Comparative Example 9 | 2.5 | Phosphoric acid | 1.4 | 3 | 89 |
| Comparative Example 10 | 2.5 | Ethylamine | 0.6 | 3 | 73 |
| Comparative Example 11 | 2.5 | Ethylamine | 0.6 | 10 | 86 |
| Comparative Example 12 | 2.5 | TMAH | 1.3 | 3 | 66 |
| Comparative Example 13 | 2.5 | TMAH | 1.3 | 10 | 0 |
| Comparative Example 14 | 2.5 | Urea | 0.8 | 3 | 69 |
| Comparative Example 15 | 2.5 | Urea | 0.8 | 10 | 72 |
| Comparative Example 16 | 2.5 | Acetoacetamide | 1.4 | 3 | 0 |
| Comparative Example 17 | 2.5 | Acetoacetamide | 1.4 | 10 | 38 |
| Comparative Example 18 | 2.5 | 1,2,4-triazole | 1.0 | 3 | 12 |
| Comparative Example 19 | 2.5 | 1,2,4-triazole | 1.0 | 10 | 28 |
| Comparative Example 20 | 10 | — | — | 3 | 5 |
| Comparative Example 21 | 10 | — | — | 10 | 17 |

TABLE 2

| | |
|---|---|
| Polishing machine: | single-side CMP polishing machine |
| Polishing pad: | polyurethane polishing pad |
| Polishing pressure: | 1.2 psi (≈85 hpa) |
| Rotational speed of platen: | 60 rpm |
| Polishing composition: | pouring onto the blanket wafer |
| Rotational speed of carrier: | 60 rpm |

Table 1 shows that when the polishing compositions of Examples 1 to 14 were used, superior effects were obtained with regard to the polishing rate as compared with when using the polishing compositions of Comparative Examples 1 to 21, which do not satisfy the conditions of the present invention.

The invention claimed is:

1. A polishing method comprising:
   providing a polishing subject having a surface comprising a phase change alloy; and
   polishing the surface comprising the phase change alloy using a polishing composition comprising abrasive grains and at least one brittle film formation agent,
   wherein the at least one brittle film formation agent is selected from the group consisting of a saturated monocarboxylic acid and an organophosphorus compound, and
   wherein the abrasive grains have an average primary particle size of 5 to 100 nm, an average secondary particle size of not more than 150 nm, and an average degree of association, which is obtained by dividing the average secondary particle size by the average primary particle size, of 1.2 to 4,
   wherein the abrasive grains are colloidal silica having a surface chemically bonded with an organic acid.

2. The polishing method according to claim 1, wherein the at least one brittle film formation agent is one or more saturated monocarboxylic acids.

3. The polishing method according to claim 2, wherein the one or more saturated monocarboxylic acids are selected from the group consisting of acetic acid, glycolic acid, lactic acid, and salicylic acid.

4. The polishing method according to claim 1, wherein the at least one brittle film formation agent is one or more organophosphorus compounds.

5. The polishing method according to claim 4, wherein the one or more organophosphorus compounds are selected from the group consisting of phosphonic acid, an alkyl phosphonic acid, HEDP, and phosphinic acid.

6. The polishing method according to claim 1, wherein the polishing composition has a pH between 10 and 12.

7. The polishing method according to claim 1, wherein the phase change alloy is GST.

8. A method for manufacturing a substrate comprising:
   providing a polishing subject having a surface comprising a phase change alloy; and
   polishing the surface comprising the phase change alloy using a polishing composition comprising abrasive grains and at least one brittle film formation agent, wherein the at least one brittle film formation agent is selected from the group consisting of a saturated monocarboxylic acid and an organophosphorus compound, and wherein the abrasive grains have an average primary particle size of 5 to 100 nm, an average secondary particle size of not more than 150 nm, and an average degree of association which is obtained by dividing the average secondary particle size by the average primary particle size, of 1.2 to 4, wherein the abrasive grains are colloidal silica having a surface chemically bonded with an organic acid.

* * * * *